United States Patent
Posseme et al.

(10) Patent No.: US 9,257,293 B2
(45) Date of Patent: Feb. 9, 2016

(54) METHODS OF FORMING SILICON NITRIDE SPACERS

(71) Applicant: Applied Materials, Inc., Santa Clara, CA (US)

(72) Inventors: Nicolas Posseme, Carantec (FR); Olivier Joubert, Meylan (FR); Thibaut David, Goncelin (FR); Thorsten Lill, Santa Clara, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/205,673

(22) Filed: Mar. 12, 2014

(65) Prior Publication Data
US 2014/0273292 A1    Sep. 18, 2014

Related U.S. Application Data

(60) Provisional application No. 61/785,669, filed on Mar. 14, 2013.

(51) Int. Cl.
| | | |
|---|---|---|
| *H01L 21/00* | (2006.01) | |
| *H01L 21/3065* | (2006.01) | |
| *H01L 21/311* | (2006.01) | |
| *H01L 29/66* | (2006.01) | |
| *H01L 29/78* | (2006.01) | |
| *H01L 21/3105* | (2006.01) | |

(52) U.S. Cl.
CPC ...... *H01L 21/3065* (2013.01); *H01L 21/31111* (2013.01); *H01L 21/31116* (2013.01); *H01L 29/66575* (2013.01); *H01L 29/66628* (2013.01); *H01L 29/7834* (2013.01); *H01L 21/3105* (2013.01)

(58) Field of Classification Search
None
See application file for complete search history.

(56) References Cited

U.S. PATENT DOCUMENTS

| | | | |
|---|---|---|---|
| 4,529,476 A | 7/1985 | Kawamoto et al. | |
| 4,857,140 A * | 8/1989 | Loewenstein | H01L 21/31116 204/192.37 |
| 5,786,276 A | 7/1998 | Brooks et al. | |
| 6,294,102 B1 * | 9/2001 | Bennett | H01L 21/31116 216/37 |
| 6,406,978 B1 * | 6/2002 | Yang | C23C 16/325 117/84 |
| 6,475,915 B1 * | 11/2002 | Wang | H01L 21/823481 257/E21.252 |
| 7,288,482 B2 | 10/2007 | Panda et al. | |
| 8,574,978 B1 * | 11/2013 | Hung | H01L 21/823807 257/E21.293 |
| 2003/0207585 A1 | 11/2003 | Choi et al. | |
| 2011/0256734 A1 * | 10/2011 | Hausmann | C23C 16/045 438/776 |
| 2013/0008378 A1 * | 1/2013 | Antonelli | C23C 16/342 118/697 |
| 2014/0170827 A1 * | 6/2014 | Zhang | H01L 29/66356 438/305 |
| 2014/0187009 A1 * | 7/2014 | Lii | H01L 21/823807 438/299 |
| 2015/0187584 A1 * | 7/2015 | Zhang | H01L 29/66356 438/305 |
| 2015/0228499 A1 * | 8/2015 | Parkinson | H01L 21/31116 438/694 |

* cited by examiner

*Primary Examiner* — Alexander Ghyka
(74) *Attorney, Agent, or Firm* — Moser Taboada; Alan Taboada (57) ABSTRACT

Embodiments of methods of forming silicon nitride spacers are provided herein. In some embodiments, a method of forming silicon nitride spacers atop a substrate includes: depositing a silicon nitride layer atop an exposed silicon containing layer and an at least partially formed gate stack disposed atop a substrate; modifying a portion of the silicon nitride layer by exposing the silicon nitride layer to a hydrogen or helium containing plasma that is substantially free of fluorine; and removing the modified portion of the silicon nitride layer by performing a wet cleaning process to form the silicon nitride spacers, wherein the wet cleaning process removes the modified portion of the silicon nitride layer selectively to the silicon containing layer.

20 Claims, 5 Drawing Sheets

METHODS OF FORMING SILICON NITRIDE SPACERS

CROSS-REFERENCE TO RELATED APPLICATIONS

This application claims benefit of U.S. provisional patent application Ser. No. 61/785,669, filed Mar. 14, 2013, which is herein incorporated by reference in its entirety.

FIELD

Embodiments of the present invention generally relate to semiconductor device fabrication.

BACKGROUND

Conventional processes for forming silicon nitride spacers typically result in under etching of a silicon nitride layer or over etching of underlying silicon containing layers of a substrate. Under etching of the silicon nitride layer may leave excess material proximate a gate stack/silicon layer interface (e.g., "foot" formation), thereby resulting in a poorly defined interface that may lead to a degradation in device performance. Over etching of an underlying silicon containing layer may reduce a thickness of the silicon containing layer to an extent that the silicon containing layer may fully amorphize during subsequent processes thereby leading to device failure.

Accordingly, the inventors have provided an improved method for forming silicon nitride spacers.

SUMMARY

Embodiments of methods of forming silicon nitride spacers are provided herein. In some embodiments, a method of forming silicon nitride spacers atop a substrate includes depositing a silicon nitride layer atop an exposed silicon containing layer and an at least partially formed gate stack disposed atop a substrate; modifying a portion of the silicon nitride layer by exposing the silicon nitride layer to a hydrogen or helium containing plasma that is substantially free of fluorine; and removing the modified portion of the silicon nitride layer by performing a wet cleaning process to form the silicon nitride spacers, wherein the wet cleaning process removes the modified portion of the silicon nitride layer selectively to the silicon containing layer.

In some embodiments, a method of forming silicon nitride spacers atop a substrate includes: depositing a silicon nitride layer atop an exposed silicon containing layer and an at least partially formed gate stack disposed atop a substrate; modifying a portion of the silicon nitride layer by exposing the silicon nitride layer to a hydrogen or helium containing plasma that is substantially free of fluorine, wherein a depth of the portion of the silicon nitride layer modified by the hydrogen or helium containing plasma is controlled by adjusting at least one of an amount of power coupled to the plasma, a pressure maintained in a process chamber utilized to perform the modification of the silicon nitride layer or a temperature of the substrate; and removing the modified portion of the silicon nitride layer by exposing the modified portion of the silicon nitride layer to an aqueous solution containing hydrofluoric (HF) acid or phosphoric ($H_3PO_4$) acid to form the silicon nitride spacers, wherein the aqueous solution removes the modified portion of the silicon nitride layer selectively to the silicon containing layer.

In some embodiments, a computer readable medium having instructions stored thereon that, when executed, cause a method of forming silicon nitride spacers atop a substrate to be performed in a process chamber. In some embodiments, the method includes depositing a silicon nitride layer atop an exposed silicon containing layer and an at least partially formed gate stack disposed atop a substrate; modifying a portion of the silicon nitride layer by exposing the silicon nitride layer to a hydrogen or helium containing plasma that is substantially free of fluorine; and removing the modified portion of the silicon nitride layer by performing a wet cleaning process to form the silicon nitride spacers, wherein the wet cleaning process removes the modified portion of the silicon nitride layer selectively to the silicon containing layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods of forming silicon nitride spacers are provided herein. In at least some embodiments, the inventive methods may advantageously reduce under etching of a silicon nitride layer or over etching of underlying silicon containing layers that typically results from conventionally utilized processes for forming silicon nitride spacers. By reducing under etching, excess material otherwise left by under etching may be reduced or eliminated, thereby providing a more clearly defined gate stack/silicon containing layer interface. By reducing over etching, a thickness of the silicon containing layer is maintained, thereby preventing amorphization of the silicon containing layer in subsequent device fabrication processes.

Figure 1:
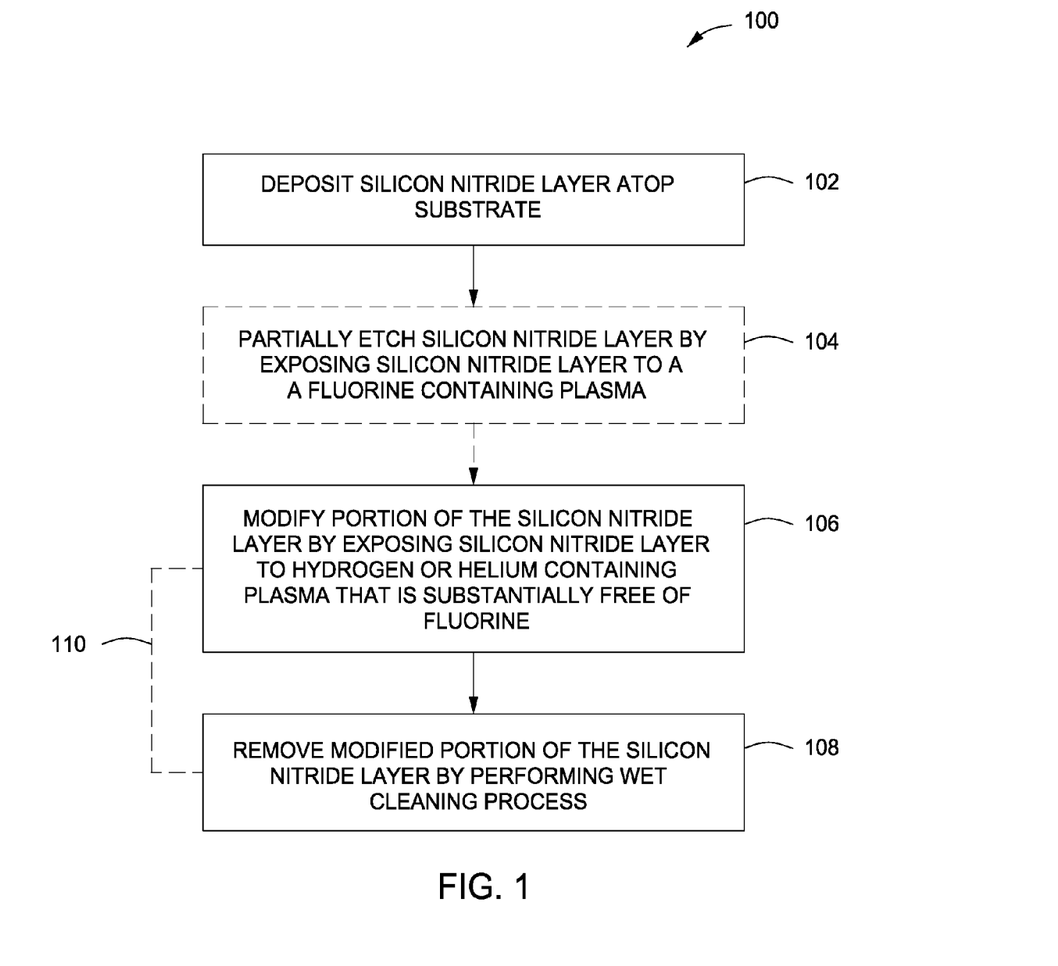
FIG. 1 depicts a method of forming silicon nitride spacers in accordance with some embodiments of the present invention.
Figure 2A:
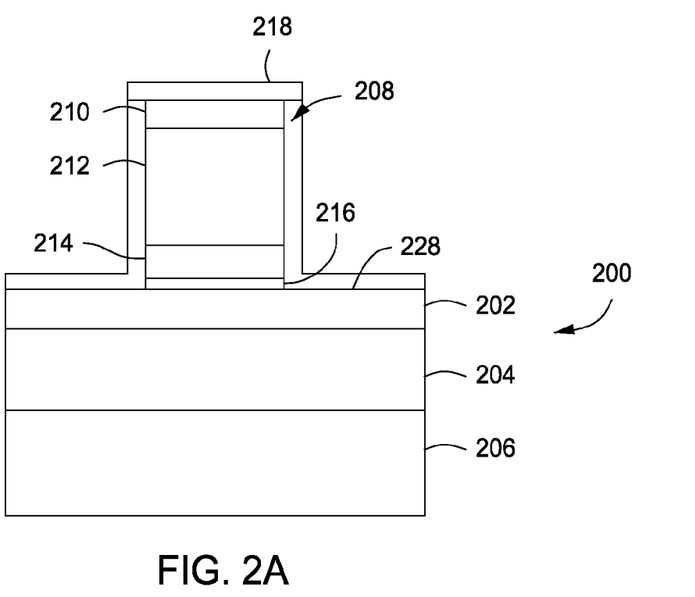
FIGS. 2A-E depict cross sectional views of a substrate during various stages of a method of forming silicon nitride spacers in accordance with some embodiments of the present invention.

FIG. 1 depicts a method 100 of forming silicon nitride spacers in accordance with some embodiments of the present invention. The method 100 generally starts at 102 where a silicon nitride layer 218 is deposited atop a substrate 200, as shown in FIG. 2A.

The substrate 200 may be any substrate suitable for semiconductor device fabrication, for example, such as a doped or un-doped silicon substrate, a III-V compound substrate, a II-VI compound substrate, a silicon germanium (SiGe) substrate, an epi-substrate, a silicon-on-insulator (SOI) substrate, oxides thereof, or the like. In some embodiments, the substrate 200 may comprise one or more layers disposed within or on the substrate. For example, in some embodiments, the substrate 200 may comprise a first silicon containing layer 202, a second silicon containing layer 206 and a buried oxide layer 204 disposed between the first silicon containing layer 202 and the second silicon containing layer 206. The first silicon containing layer 202, the second silicon containing layer 206 and buried oxide layer 204 may comprise any materials suitable for semiconductor device fabrication. For example, in some embodiments, at least one of the first silicon containing layer 202 and the second silicon containing layer 206 may be a bulk silicon layer comprising crystalline silicon or a silicon oxide ($SiO_2$) layer. In some embodiments, the buried oxide layer 204 may comprise silicon oxide ($SiO_2$), aluminum oxide ($Al_2O_3$), or the like.

Alternatively or in combination, in some embodiments, one or more features (e.g., a via, a trench, a dual damascene structure, or the like) may be formed in or on the substrate 200 and/or one or more of the one or more layers disposed in or on the substrate. In such embodiments, the one or more features may be a high aspect ratio feature (e.g., high aspect ratio via). As used herein, a high aspect ratio feature is a feature having an aspect ratio of length to width of at least 4:1, or in some embodiments, at least 5:1.

In some embodiments, a gate stack 208 is at least partially formed atop the substrate 200. The gate stack 208 may comprise any materials suitable to form a semiconductor device (e.g., multigate device, fin field effect transistor (FinFET), nanowire field effect transistor (NWFET), tri-gate transistor, a p-type or n-type metal-oxide-semiconductor field-effect transistor (MOSFET), or the like). For example, in some embodiments, the gate stack 208 may comprise a high-k dielectric layer 216 (e.g., having a dielectric constant equal to or greater than about 3.9), a metal layer 214 disposed atop the high-K dielectric layer 216 and a polysilicon gate layer 212 disposed atop the metal layer 214. In some embodiments, a hard mask layer 210 may be disposed atop the polysilicon gate layer 212. When present, the hard mask layer 210 may protect the underlying gate stack layers to prevent and/or limit undesired etching or deposition of the gate stack during formation of the silicon nitride spacers, as provided herein. The hard mask layer 210 may comprise any process compatible materials suitable to protect the underlying layers, for example, such as silicon oxide ($SiO_2$).

The silicon nitride ($Si_3N_4$) layer 218 may be deposited atop any portion of the substrate 200 suitable to form the silicon nitride spacers in a desired location. For example, in some embodiments, the silicon nitride layer 218 is deposited atop an exposed surface 228 of the first silicon containing layer 202 and the gate stack 208. The silicon nitride layer 218 may be deposited via any deposition process suitable to deposit the silicon nitride layer 218 to a desired thickness. For example, in some embodiments, the silicon nitride layer 218 may be deposited via a chemical vapor deposition (CVD) process such as a low pressure chemical vapor deposition (LPCVD) process.

The silicon nitride layer 218 maybe deposited to any thickness suitable to facilitate forming the silicon nitride spacers having desired dimensions.

Figure 2B:
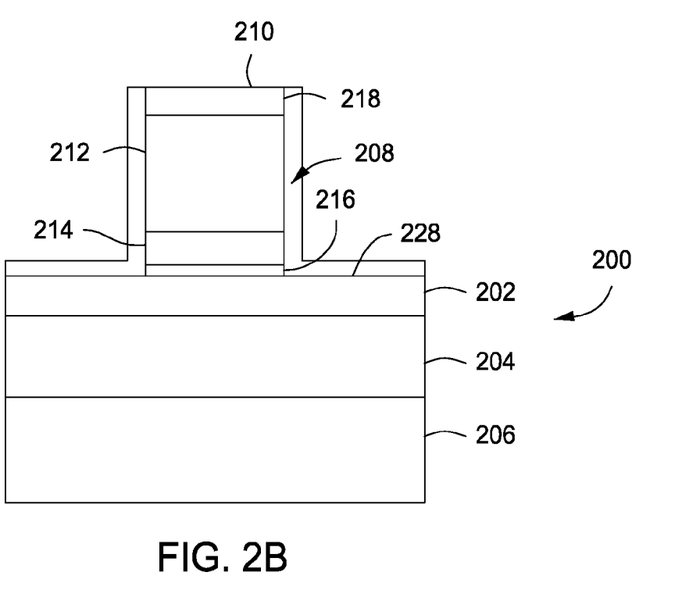

Next, at 104, the silicon nitride layer 218 may be optionally partially etched, as shown in FIG. 2B. Partially etching the silicon nitride layer 218 removes at least some of the silicon nitride layer 218 to define at least a portion of the silicon nitride spacers.

The silicon nitride layer 218 may be etched via any etch process suitable to remove a desired amount of material from the silicon nitride layer 218. For example, in some embodiments, the silicon nitride layer 218 may be exposed to a fluorine containing plasma. In such embodiments, the fluorine containing plasma may be formed by coupling power from a power source to a fluorine containing process gas to ignite the process gas to form the plasma. In some embodiments, the fluorine-containing gas may comprise gases that can be dissociated to form free fluorine, such as $NF_3$, $SF_6$, $CF_4$, or the like. In some embodiments, a fluorocarbon-containing gas may be provided that comprises gases that dissociate to form F radicals and $CF_x$ (where x is a positive integer), such as $CF_4$, $C_2F_6$, $C_4F_8$, or the like. In some embodiments, a hydrofluorocarbon-containing gas may be provided that comprises gases that dissociate to form F radicals and $CF_x$, as well as that provides hydrogen (H) that combines with the free fluorine in the plasma to increase the C:F ratio (or C:H:F ratio), such as $CH_2F_2$, $CH_4$, $CHF_3$, or the like. In some embodiments, the process gas may include other gases, for example, a diluent gas, carrier gas, or the like.

In some embodiments, a depth of the silicon nitride layer 218 etch may be controlled via adjusting the plasma conditions (e.g., power and frequency utilized to form or maintain the plasma, amount of time the silicon nitride layer 218 is exposed to the plasma, temperature maintained in the process chamber, temperature of the substrate, pressure maintained in the process chamber, or the like).

Figure 2C:
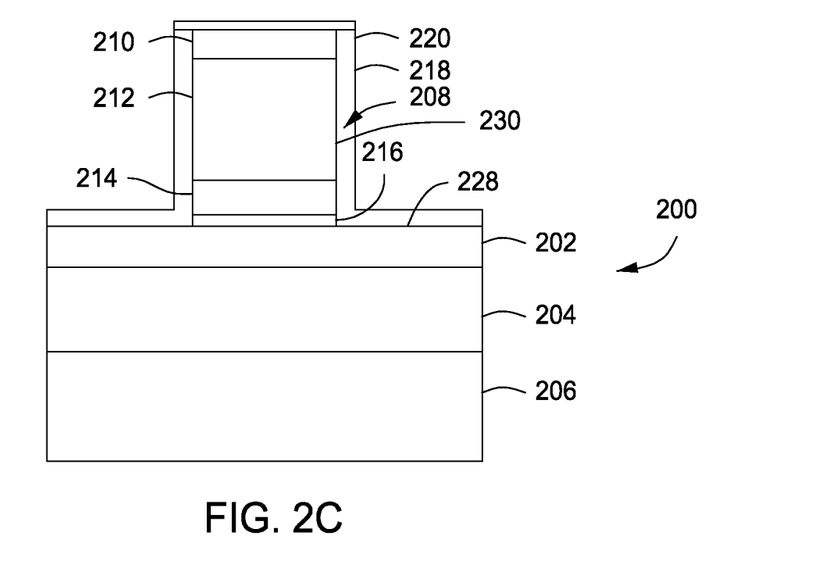

Next, at 106, a portion of the silicon nitride layer 218 may be modified by exposing the silicon nitride layer 218 to a hydrogen or helium containing plasma that is substantially free of fluorine, as shown in FIG. 2C (modified portion of the silicon nitride layer 218 shown at 220). Modifying the portion 220 of the silicon nitride layer 218 in the manner described above allows for the removal of the modified portion of the silicon nitride layer 218 in a subsequent wet cleaning process to form the silicon nitride spacers (e.g., as described below).

The plasma may be formed from any suitable hydrogen or helium containing process gas suitable to modify the portion of the silicon nitride layer 218 as described above. For example, in embodiments where the plasma is a hydrogen containing plasma, the process gas may comprise one or more of hydrogen gas ($H_2$), ammonia ($NH_3$), methane ($CH_4$), or the like. In embodiments where the plasma is a helium containing plasma, the process gas may predominantly comprise a helium (He) gas. In some embodiments, the process gas may include other gases, for example, a diluent gas, carrier gas, or the like.

In some embodiments, a depth of the modification of the silicon nitride layer 218 may be controlled via adjusting the plasma conditions (e.g., power and frequency utilized to form or maintain the plasma, amount of time the silicon nitride layer 218 is exposed to the plasma, temperature maintained in the process chamber, temperature of the substrate, pressure maintained in the process chamber, or the like).

The silicon nitride layer 218 may be modified to any depth suitable to form the silicon nitride spacers in a desired location and having desired dimensions after removal of the modified portion 220 of the silicon nitride layer 218, as described below. In addition, in some embodiments, the silicon nitride layer 218 may be modified to differing depths at different locations of the substrate 200. For example, in some embodiments, a depth of the modification induced by the plasma is about 1 to about 2 nm on a sidewall 230 of the gate stack 208, and about 2 to about 8 nm on the exposed surface 228 of the first silicon containing layer 202.

Figure 2D:
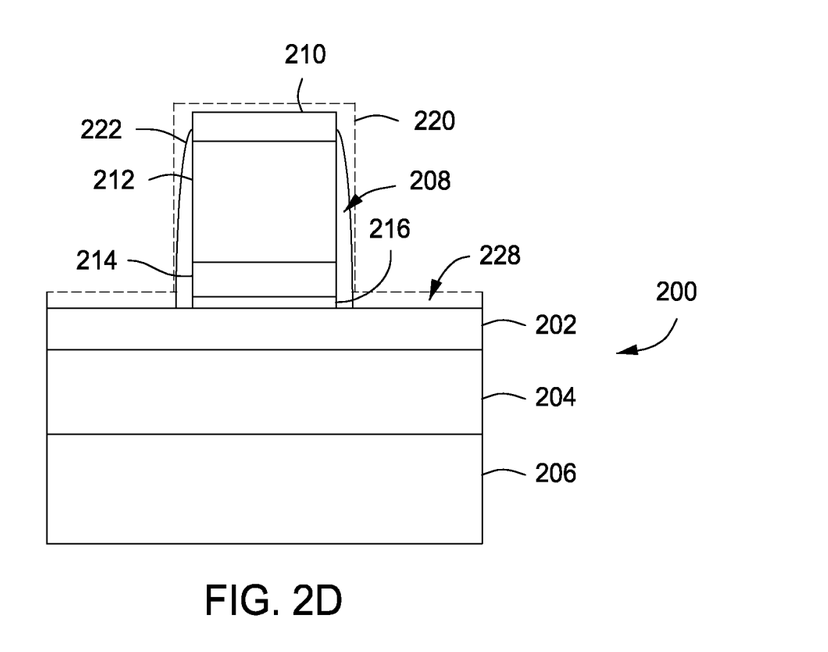

Next, at 108, the modified portion 220 of the silicon nitride layer 218 is removed by performing a wet cleaning process, such as shown in FIG. 2D. The wet cleaning process selectively removes the modified portion 220 of silicon nitride layer 218 while not removing material from the gate stack 208, the first silicon containing layer 202 and the non-modified portion of the silicon nitride layer 218 to form the silicon nitride spacers 222. The silicon nitride spacers 222 may be formed to any thickness suitable to facilitate fabrication of a desired semiconductor device. For example, in some embodiments, the silicon nitride spacers 222 may be formed to a thickness of at least 3 nm.

Conventional processes for forming silicon nitride spacers typically result in under etching of a silicon nitride layer (e.g., the silicon nitride layer 218) or over etching of underlying silicon containing layers (e.g., first silicon containing layer 202). Under etching of the silicon nitride layer 218 may leave excess material proximate the gate stack 208/silicon nitride layer 218 interface (e.g., "foot" formation), thereby resulting in a poorly defined, non-abrupt gate stack 208/silicon nitride layer 218 interface that may lead to poor device performance. Over etching of an underlying silicon containing layer may cause silicon recesses and reduce a thickness of the silicon containing layer to an extent that the silicon containing layer may fully amorphize during subsequent processes (e.g., ion implantation, epitaxial layer growth), thereby leading to device failure. Accordingly, the inventors have observed that by selectively removing the modified portion 220 of the silicon nitride layer 218 in the manner described herein, the silicon nitride spacers 222 may be defined while reducing or eliminating the above described over or under etching of the silicon nitride layer 218 that results in conventional processes typically used to form silicon nitride spacers.

The wet cleaning process may be any wet cleaning process suitable to selectively remove the modified portion 220 of silicon nitride layer 218. For example, in some embodiments, the wet cleaning process may include exposing the modified portion 220 of silicon nitride layer 218 to a liquid-phase etchant, for example, such as phosphoric acid ($H_3PO_4$), hydrofluoric acid (HF), or the like. In some embodiments, the etchant may comprise a solvent, for example, water. For example, in embodiments where the etchant comprises hydrofluoric acid, the etchant may be an aqueous solution having about 1% hydrofluoric acid.

After the modified portion of the silicon nitride layer is removed at 108 the method 100 generally ends and the substrate 200 may proceed for further processing. In some embodiments, a portion of the process may be cyclical. For example, in some embodiments the method may return to 106 (as shown by the arrow 110) where another portion of the silicon nitride layer may be modified and then subsequently removed at 108. The cycle may repeat any number of times necessary to provide silicon nitride spacers having desired dimensions.

Figure 2E:
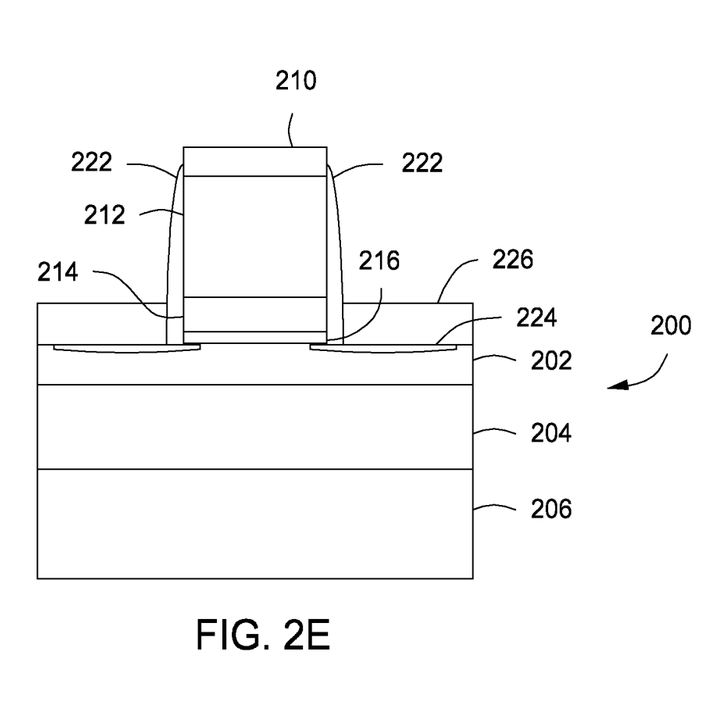

In some embodiments, following the removal of the modified portion of the silicon nitride layer at 108 additional processes may be performed to further fabricate a semiconductor device. In some embodiments, an implantation process may be performed to form an n-type MOSFET device or a p-type MOSFET device, such as shown in FIG. 2E. For example, in some embodiments, arsenic (As) or phosphorous (P) may be implanted (implant shown at 224) to form an n-type MOSFET device or boron difluoride ($BF_2$) to form a p-type MOSFET device. Alternatively or in combination, one or more layers 226 may be deposited atop the first silicon containing layer 202 (or implants 224 when present) via an epitaxial process.

Figure 3:
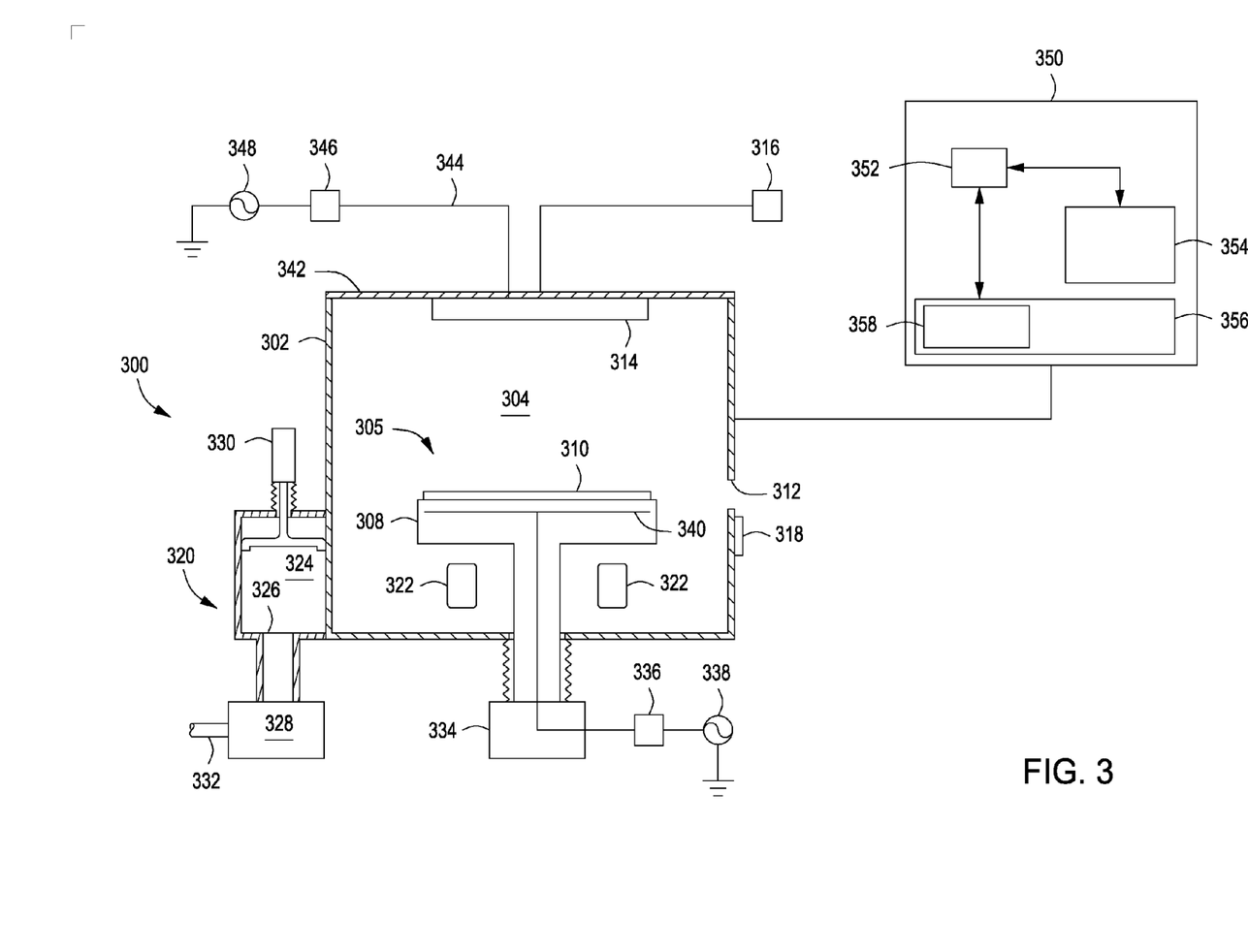
FIG. 3 depicts a process chamber suitable to perform a method forming silicon nitride spacers in accordance with some embodiments of the present invention.

FIG. 3 depicts an apparatus 300 suitable for processing a substrate in accordance with some embodiments of the present invention. The apparatus 300 may comprise a controller 350 and a process chamber 302 having an exhaust system 320 for removing excess process gases, processing by-products, or the like, from the interior of the process chamber 302. Exemplary process chambers may include the DPS®, ENABLER®, ADVANTEDGE™, or other process chambers, available from Applied Materials, Inc. of Santa Clara, Calif. Other suitable process chambers may similarly be used.

The process chamber 302 has an inner volume 305 that may include a processing volume 304. The processing volume 304 may be defined, for example, between a substrate support pedestal 308 disposed within the process chamber 302 for supporting a substrate 310 thereupon during processing and one or more gas inlets, such as a showerhead 314 and/or nozzles provided at desired locations. In some embodiments, the substrate support pedestal 308 may include a mechanism that retains or supports the substrate 310 on the surface of the substrate support pedestal 308, such as an electrostatic chuck, a vacuum chuck, a substrate retaining clamp, or the like (not shown). In some embodiments, the substrate support pedestal 308 may include mechanisms for controlling the substrate temperature (such as heating and/or cooling devices, not shown) and/or for controlling the species flux and/or ion energy proximate the substrate surface.

For example, in some embodiments, the substrate support pedestal 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 12,000 W at a frequency of about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. In some embodiments, three bias power sources may be provided for coupling RF power through respective matching networks to the RF bias electrode 340 at respective frequencies of about 2 MHz, about 13.56 MHz, and about 60 Mhz. The at least one bias power source may provide either continuous or pulsed power. In some embodiments, the bias power source alternatively may be a DC or pulsed DC source.

The substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support pedestal 308 may be coupled to a lift mechanism 334 that may control the position of the substrate support pedestal 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support pedestal 308 may be disposed above the opening 312 to provide a symmetrical processing region.

The one or more gas inlets (e.g., the showerhead 314) may be coupled to a gas supply 316 for providing one or more process gases into the processing volume 304 of the process chamber 302. Although a showerhead 314 is shown in FIG. 3, additional or alternative gas inlets may be provided such as nozzles or inlets disposed in the ceiling or on the sidewalls of the process chamber 302 or at other locations suitable for providing gases as desired to the process chamber 302, such as the base of the process chamber, the periphery of the substrate support pedestal, or the like.

In some embodiments, the apparatus 300 may utilize capacitively coupled RF power for plasma processing, although the apparatus may also or alternatively use inductive coupling of RF power for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 5,000 W at a frequency of about 2 MHz and or about 13.56 MHz or high frequency, such as 27 MHz and/or 60 MHz.

The exhaust system 320 generally includes a pumping plenum 324 and one or more conduits that couple the pumping plenum 324 to the inner volume 305 (and generally, the processing volume 304) of the process chamber 302, for example via one or more inlets 322 (two inlets shown in FIG. 3). A vacuum pump 328 may be coupled to the pumping plenum 324 via a pumping port 326 for pumping out the exhaust gases from the process chamber 302. The vacuum pump 328 may be fluidly coupled to an exhaust outlet 332 for routing the exhaust as required to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present invention. The software routine 358 may also be stored and/or executed by a second CPU (not shown) that is remotely located from the hardware being controlled by the CPU 352. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine 358 may be executed after the substrate 310 is positioned on the substrate support pedestal 308. The software routine 358, when executed by the CPU 352, transforms the general purpose computer into a specific purpose computer (controller) 350 that controls the chamber operation such that the methods disclosed herein are performed.

Thus, embodiments of methods of forming silicon nitride spacers have been provided herein. In at least some embodiments, the inventive method may advantageously reduce under etching of a silicon nitride layer or over etching of underlying silicon containing layers that typically results from conventionally utilized processes for forming silicon nitride spacers.

While the foregoing is directed to embodiments of the present invention, other and further embodiments of the invention may be devised without departing from the basic scope thereof.

The invention claimed is:

1. A method of forming silicon nitride spacers atop a substrate, comprising:
  depositing a silicon nitride layer atop an exposed silicon containing layer and an at least partially formed gate stack disposed atop a substrate;
  modifying a portion of the silicon nitride layer by exposing the silicon nitride layer to a hydrogen or helium containing plasma that is substantially free of fluorine; and
  removing the modified portion of the silicon nitride layer by performing a wet cleaning process to form the silicon nitride spacers, wherein the wet cleaning process removes the modified portion of the silicon nitride layer selectively to the silicon containing layer.

2. The method of claim 1, further comprising:
  partially etching the silicon nitride layer by exposing the silicon nitride layer to a fluorine containing plasma.

3. The method of claim 1, wherein the silicon nitride layer is modified to a depth of about 1 to about 2 nm atop a sidewall of the at least partially formed gate stack and to a depth of about 2 to about 8 nm atop the exposed silicon containing layer.

4. The method of claim 1, further comprising:
  subsequent to removing the modified portion of the silicon nitride layer, repeatedly modifying a portion of the silicon nitride layer by exposing the silicon nitride layer to a hydrogen or helium containing plasma that is substantially free of fluorine and subsequently removing the modified portion of the silicon nitride layer by performing a wet cleaning process until the silicon nitride spacers having desired dimensions are formed.

5. The method of claim 1, wherein the silicon nitride spacers are formed to a thickness of at least 3 nm.

6. The method of claim 1, wherein the wet cleaning process comprises exposing the modified portion of the silicon nitride layer to an aqueous solution containing hydrofluoric (HF) acid or phosphoric ($H_3PO_4$) acid.

7. The method of claim 1, wherein the hydrogen or helium containing plasma is formed from a process gas comprising one of helium (He) gas, hydrogen ($H_2$) gas, ammonia ($NH_3$), or methane ($CH_4$).

8. The method of claim 1, wherein a depth of the portion of the silicon nitride layer modified by the hydrogen or helium containing plasma is controlled by adjusting at least one of an amount of power coupled to the plasma, a pressure maintained in a process chamber utilized to perform the modification of the silicon nitride layer or a temperature of the substrate.

9. The method of claim 1, further comprising:
  subsequent to removing the modified portion of the silicon nitride layer, performing an implantation process to implant an arsenic (As) containing material or a phosphorous (P) containing material in the exposed silicon containing layer to form a n-type MOSFET device or to implant a boron difluoride ($BF_2$) in the exposed silicon containing layer to form a p-type MOSFET device.

10. The method of claim 1, further comprising:
subsequent to removing the modified portion of the silicon nitride layer forming an epitaxial layer atop the silicon containing layer.

11. The method of claim 1, wherein the exposed silicon containing layer comprises one of crystalline silicon (Si) or crystalline silicon oxide ($SiO_2$).

12. A method of forming silicon nitride spacers atop a substrate, comprising:
depositing a silicon nitride layer atop an exposed silicon containing layer and an at least partially formed gate stack disposed atop a substrate;
modifying a portion of the silicon nitride layer by exposing the silicon nitride layer to a hydrogen or helium containing plasma that is substantially free of fluorine, wherein a depth of the portion of the silicon nitride layer modified by the hydrogen or helium containing plasma is controlled by adjusting at least one of an amount of power coupled to the plasma, a pressure maintained in a process chamber utilized to perform the modification of the silicon nitride layer or a temperature of the substrate; and
removing the modified portion of the silicon nitride layer by exposing the modified portion of the silicon nitride layer to an aqueous solution containing hydrofluoric (HF) acid or phosphoric ($H_3PO_4$) acid to form the silicon nitride spacers, wherein the aqueous solution removes the modified portion of the silicon nitride layer selectively to the silicon containing layer.

13. A computer readable medium having instructions stored thereon that, when executed, cause a method of forming silicon nitride spacers atop a substrate to be performed in a process chamber, the method comprising:
depositing a silicon nitride layer atop an exposed silicon containing layer and an at least partially formed gate stack disposed atop a substrate;
modifying a portion of the silicon nitride layer by exposing the silicon nitride layer to a hydrogen or helium containing plasma that is substantially free of fluorine; and
removing the modified portion of the silicon nitride layer by performing a wet cleaning process to form the silicon nitride spacers, wherein the wet cleaning process removes the modified portion of the silicon nitride layer selectively to the silicon containing layer.

14. The computer readable medium of claim 13, further comprising:
partially etching the silicon nitride layer by exposing the silicon nitride layer to a fluorine containing plasma.

15. The computer readable medium of claim 13, wherein the silicon nitride layer is modified to a depth of about 1 to about 2 nm atop a sidewall of the at least partially formed gate stack and to a depth of about 2 to about 8 nm atop the exposed silicon containing layer.

16. The computer readable medium of claim 13, further comprising:
subsequent to removing the modified portion of the silicon nitride layer, repeatedly modifying a portion of the silicon nitride layer by exposing the silicon nitride layer to a hydrogen or helium containing plasma that is substantially free of fluorine and subsequently removing the modified portion of the silicon nitride layer by performing a wet cleaning process until the silicon nitride spacers having desired dimensions are formed.

17. The computer readable medium of claim 13, wherein the silicon nitride spacers are formed to a thickness of at least 3 nm.

18. The computer readable medium of claim 13, wherein the wet cleaning process comprises exposing the modified portion of the silicon nitride layer to an aqueous solution containing hydrofluoric (HF) acid or phosphoric ($H_3PO_4$) acid.

19. The computer readable medium of claim 13, wherein the hydrogen or helium containing plasma is formed from a process gas comprising one of helium (He) gas, hydrogen ($H_2$) gas, ammonia ($NH_3$), or methane ($CH_4$).

20. The computer readable medium of claim 13, wherein a depth of the portion of the silicon nitride layer modified by the hydrogen or helium containing plasma is controlled by adjusting at least one of an amount of power coupled to the plasma, a pressure maintained in a process chamber utilized to perform the modification of the silicon nitride layer or a temperature of the substrate.

\* \* \* \* \*